United States Patent
Corvasce

(10) Patent No.: US 9,825,158 B2
(45) Date of Patent: Nov. 21, 2017

(54) INSULATED GATE BIPOLAR TRANSISTOR

(71) Applicant: ABB Technology AG, Zurich (CH)

(72) Inventor: Chiara Corvasce, Bergdietikon (CH)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 15/151,334

(22) Filed: May 10, 2016

(65) Prior Publication Data
US 2016/0254376 A1 Sep. 1, 2016

Related U.S. Application Data

(63) Continuation of application No. PCT/EP2014/073361, filed on Oct. 30, 2014.

(30) Foreign Application Priority Data

Nov. 29, 2013 (EP) .................................. 13195083

(51) Int. Cl.
H01L 29/739 (2006.01)
H01L 29/06 (2006.01)
(Continued)

(52) U.S. Cl.
CPC ........ *H01L 29/7397* (2013.01); *H01L 29/063* (2013.01); *H01L 29/0642* (2013.01);
(Continued)

(58) Field of Classification Search
CPC ............. H01L 29/1095; H01L 29/7397; H01L 29/4238; H01L 29/66325; H01L 29/7393;
(Continued)

(56) References Cited

U.S. PATENT DOCUMENTS

2003/0141542 A1   7/2003 Ishimura et al.
2003/0168713 A1   9/2003 Narazaki et al.
(Continued)

FOREIGN PATENT DOCUMENTS

JP   2010-109545 A   5/2010

OTHER PUBLICATIONS

European Patent Office, Extended Search Report issued in corresponding Application No. 13195083.4, dated Apr. 17, 2014, 6 pp.
(Continued)

*Primary Examiner* — Shahed Ahmed
(74) *Attorney, Agent, or Firm* — Taft Stettinius & Hollister LLP

(57) ABSTRACT

An IGBT is provided having a first gate unit having first trench gates with first conductive layers and planar gates with second conductive layers. A second gate unit having a second trench gates may be connected to the emitter electrode, with the first and second conductive layers forming a first shape closed in itself and enclosing the second gate unit. Third trench gates are arranged between a planar gate and the second gate unit such that first and third trench gates are connected and form a second shape closed in itself by which the second gate unit is enclosed. P+ doped bars below the planar gate contact the emitter electrode with each third trench gate separating a bar and a planar gate electrode from the second gate unit, with a p doped base layer separating the second gate unit from the enclosing second shape.

20 Claims, 4 Drawing Sheets

(51) Int. Cl.
 *H01L 29/10* (2006.01)
 *H01L 29/423* (2006.01)
(52) U.S. Cl.
 CPC ...... *H01L 29/0696* (2013.01); *H01L 29/1095* (2013.01); *H01L 29/4238* (2013.01)
(58) Field of Classification Search
 CPC ............... H01L 29/063; H01L 29/7395; H01L 29/0642; H01L 29/0696
 USPC ....... 257/197, 205, 370, 474, 477, 498, 517, 257/565, 590; 438/170, 189, 234, 309, 438/336, 340
 See application file for complete search history.

(56) References Cited

U.S. PATENT DOCUMENTS

| | | |
|---|---|---|
| 2005/0045960 A1 | 3/2005 | Takahashi |
| 2010/0123186 A1* | 5/2010 | Ohta .................... H01L 29/0634 257/329 |
| 2010/0327313 A1 | 12/2010 | Nakamura |
| 2011/0193132 A1* | 8/2011 | Kouno ................ H01L 29/0619 257/139 |
| 2012/0043581 A1 | 2/2012 | Koyama et al. |
| 2013/0260515 A1* | 10/2013 | Mizushima ....... H01L 29/66325 438/135 |
| 2014/0197451 A1* | 7/2014 | Chen ................... H01L 29/7393 257/139 |
| 2016/0372460 A1* | 12/2016 | Momota ............. H01L 27/0629 |

OTHER PUBLICATIONS

European Patent Office, International Search Report & Written Opinion issued in corresponding Application No. PCT/EP2014/073361, dated Jan. 26, 2015, 11 pp.

\* cited by examiner

INSULATED GATE BIPOLAR TRANSISTOR

FIELD OF INVENTION

The invention relates to the field of power semiconductor devices. It relates to an Insulated Gate Bipolar according to the preamble of claim 1.

BACKGROUND OF THE INVENTION

In WO 2013/007654 A1 a prior art IGBT having trench gate electrodes is described. The IGBT comprises an (n-) lowly doped drift layer between an emitter side and a collector side. Towards the collector side, a collector layer is arranged on the drift layer. A p doped base layer is arranged between the drift layer and the emitter electrode. The base layer is completely separated from the drift layer by an n doped enhancement layer, which is higher doped than the drift layer. Due to the enhancement layer losses are lowered. An n doped source region is arranged on the base layer towards the emitter side and electrically contacts the emitter electrode. The source region has a higher doping concentration than the drift layer.

At least two first trench gate electrodes are arranged lateral to the base layer and extend deeper into the drift layer from the emitter side than the base layer. Each first trench gate electrode is separated from any surrounding layer or region (base layer, the enhancement layer and the drift layer) by a third insulating layer.

A first channel is formable from the emitter electrode, the source region, the base layer and the drift layer between two first trench gate electrodes. The source region is arranged between two first trench gate electrodes. The trench gate electrodes may have any design well-known to the experts like cellular design, full or part stripes. The first trench gate electrodes are insulated from the emitter electrode by another insulating layer.

A "grounded" gate electrode comprises a second trench gate electrode and a fifth electrically conducting layer, both of which are grounded, i.e. they are on the potential of the emitter electrode. The second trench gate electrode is arranged lateral to the base layer and extends deeper into the drift layer than the base layer. The second trench gate electrode is separated from the layers surrounding it, i.e. the base layer, the enhancement layer and the drift layer, by a third insulating layer.

An electrically conductive fifth layer covers and laterally extends outside the second trench gate electrode at least to a region above the base layer. The second trench gate electrode is mechanically and electrically connected to the electrically conductive layer. The electrically conductive layer contacts the second trench gate electrode at a recess and is thereby grounded.

The second trench gate electrodes have the potential of the emitter electrode and thereby, restrict the controllable trenches to the designed active channel regions. The use of a T-trench shorted to the emitter electrode in the region between gated (active) trenches, provides the required blocking capability by preventing in blocking state the electric field line crowding at the active trench cell.

According to WO 2006/125330 A1 a p doped bar having higher doping concentration than the p base layer may be arranged such that the source regions, the base layer, the first and second trench gate electrode terminate at the bar. The bar extends to the surface of the wafer. The bar extends in a plane parallel to the emitter side perpendicular to the direction, in which the first source regions attach the first trench gate electrodes or in which the enhancement layer separated the base layer from the second trench gate electrode. The p+ bar shall be biased, i.e. electrically connected to the emitter electrode hence providing an alternative path for the holes during dynamic avalanche. In this way the hole current during dynamic avalanche is partially flowing through the p+ bars allowing the cell to reach the critical latch up current for higher values of the total turn-off current. However for such a case, the highly doped p bar would create an undesired low impedance path between the emitter electrode in the active cell and the base layer on the side of the second gate unit enabling the drainage of the holes accumulated during the conduction state in the area of the dummy trenches (second gate unit). As a consequence a device with biased p+ bars would have higher conduction losses than a device with fully floating p+ bars.

DESCRIPTION OF THE INVENTION

It is an object of the invention to provide a power semiconductor device with reduced on-state and switching losses, improved blocking capability and good controllability, which is easier to manufacture than prior art devices.

The problem is solved by the semiconductor device with the characteristics of claim 1.

The inventive insulated gated bipolar transistor has the following layers between an emitter electrode on an emitter side and a collector electrode on a collector side opposite to the emitter side:

- a lowly doped drift layer of a first conductivity type;
- a collector layer of a second conductivity type different than the first conductivity type, which is arranged between the drift layer and the collector electrode and which electrically contacts the collector electrode;
- a base layer of the second conductivity type, which base layer is arranged between the drift layer and the emitter electrode, which base layer electrically contacts the emitter electrode;
- a source region of the first conductivity type, which is arranged on the base layer towards the emitter side and electrically contacts the emitter electrode, which source region has a higher doping concentration than the drift layer;
- a first gate unit, which comprises at least two first trench gate electrodes and at least two planar gate electrodes. Each first trench gate electrode has a first electrically conductive layer and a first insulating layer, wherein each first electrically conductive layer is separated from any layer of the first or second conductivity type, which adjoins said first trench gate electrode, by one of the at least two first insulating layers. The source region abuts on at least one first trench gate electrode. Each planar gate electrode has a second electrically conductive layer and a second insulating layer, wherein each second electrically conductive layer is separated from any layer of the first or second conductivity type, which adjoins said planar gate electrode, by one of the at least two second insulating layers;
- a second gate unit, which comprises at least one second trench gate electrode, wherein the at least one second trench gate electrode comprises a third electrically conductive layer and a third insulating layer, which at least one second trench gate electrode is separated from any layer of the first or second conductivity type, which adjoin the second trench gate electrode, by the third insulating layer. The at least one third electrically conductive layer is electrically connected to the emitter electrode. The at least one third electrically conductive layer may be covered by a fifth electrically conductive layer, thereby forming a dummy trench, which fifth electrically conductive layer connects a plurality of the at least one third electrically conductive layers. In this embodiment, the contact of the at least one third electrically conductive layer to the emitter electrode may be made via the fifth electrically conductive layer. Each second electrically conductive layer contacts a first electrically conductive layer such that the first and second electrically conductive layers form a first shape closed in itself by which first shape the first gate unit encloses the second gate unit.

at least two third trench gate electrodes, each of which has a fourth electrically conductive layer and a fourth insulating layer, wherein the fourth electrically conductive layer is separated from any layer of the first or second conductivity type, which adjoins said third trench gate electrode, by the fourth insulating layer. Each of the at least two third trench gate electrode is arranged between one of the at least one planar gate electrode and the second gate unit such that at least one first and third trench gate electrodes are electrically connected and form a second shape closed in itself so that the second shape encloses the second gate unit;

at least two bars of the second conductivity type, each of which is arranged below the planar gate electrode such that each bar separates a planar gate electrode from any other layer of the first or second conductivity type at least on a side opposite to a third trench gate electrode. The at least two bars extend to and electrically contact the emitter electrode. The at least two bars have at least one of a higher maximum doping concentration or a greater depth from the emitter side than the base layer.

Each of the at least two third trench gate electrodes separates one of the at least two bars and one of the at least two planar gate electrodes from the second gate unit. The base layer separates the second gate unit from the enclosing second shape in a plane parallel to the emitter side.

Due to the third trench gate electrode the part of the base layer, which is arranged at the side of the second gate unit is disconnected from the highly doped bar.

The second trench gate electrode is connected to the first gate unit and, thus, the third trench gate electrode is on the same potential as the first gate unit. This third trench gate electrode disconnects the highly doped p bar connected to the emitter electrode from the base layer on the side of the second gate unit so preventing the drainage of the charge built in the pitched region at the emitter electrode through the highly doped p+ bars. As a result the device keeps low conduction losses while remaining robust against dynamic avalanche due to the highly doped p+ bar action.

The inventive device is easy to manufacture, because the third trench gate electrode can be manufactured simultaneously with the first gate unit, i.e. no additional masks are needed for its creation.

The inventive IGBT introduces a transversal active trench able to disconnect the base layer at the dummy trench side, i.e. the side towards the second gate unit, from the highly doped bars without any additional mask. Such transversal "isolation" trench, being connected to the active gate potential of the first trench gate electrode, also improves the charge accumulation in the pitched region surrounding the fifth electrically conductive poly plate of the dummy trench, providing a further improvement to the conduction losses.

The deep and/or highly doped bar connects the channel diffusion in the emitter cell regions at the first trench gate electrodes, but remains isolated from it in the PiN area where the dummy trenches are, thanks to the third trench gate electrode acting as an isolation trench.

Further advantages according to the present invention will be apparent from the dependent claims.

BRIEF DESCRIPTION OF THE DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

DETAILED DESCRIPTION OF PREFERRED EMBODIMENTS

Figure 1:
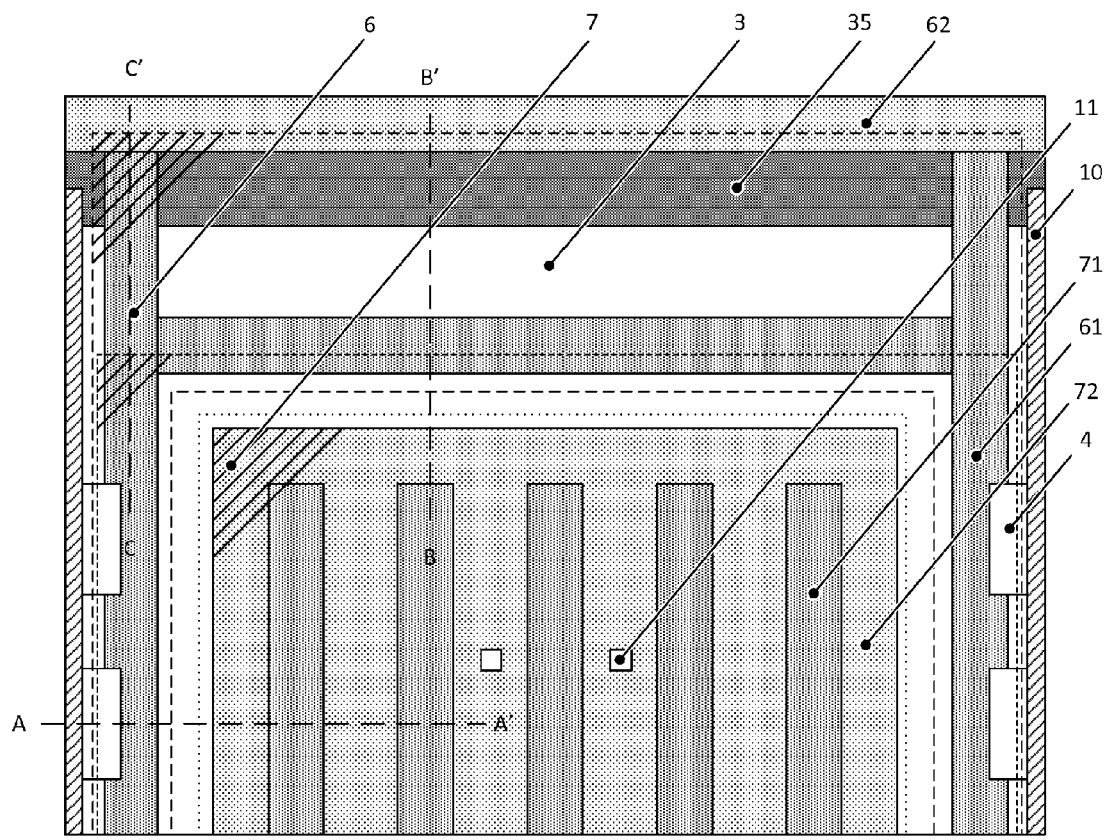
FIG. 1 shows a top view on an exemplary embodiment of an IGBT according to the invention.
Figure 6:
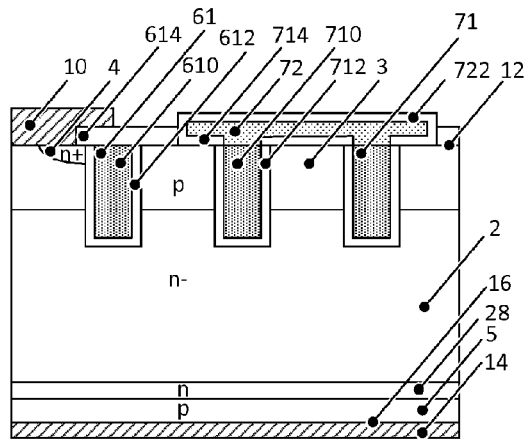
Figure 7:
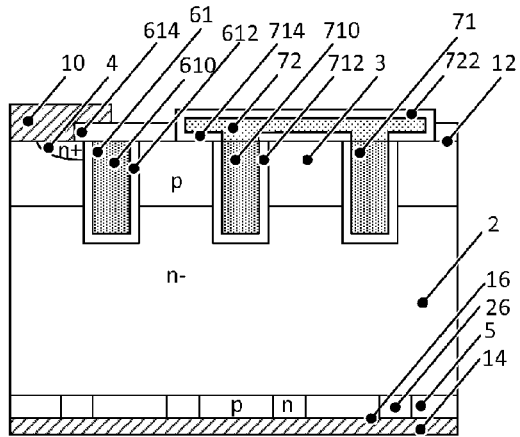
Figure 8:
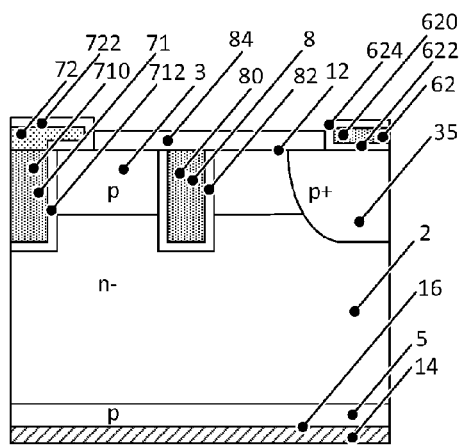
FIGS. 8 to 11 show a cut through the line B-B' of FIG. 1 of different embodiments of an IGBT according to the invention.
Figure 9:
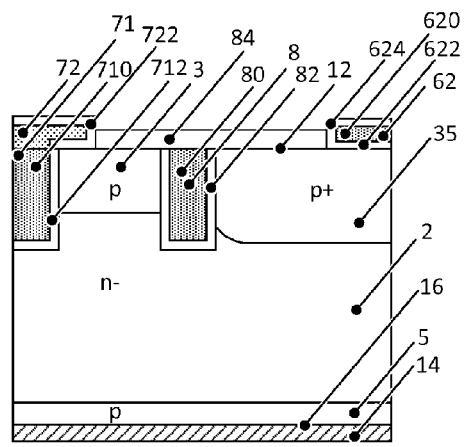
Figure 12:
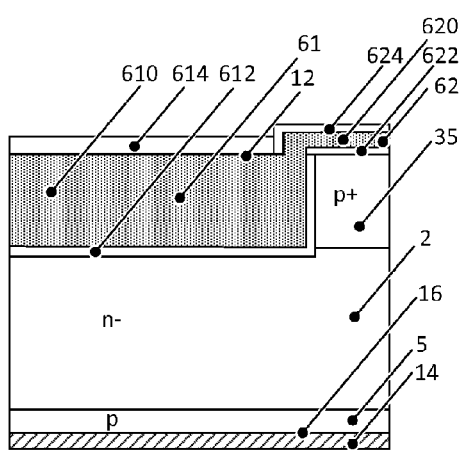
FIG. 12 shows a cut through the line C-C' of FIG. 1.

FIG. 1 shows a top view on an insulated gate bipolar transistor (also called IGBT) 1 according to the invention, whereas the FIGS. 2 to 7 show a cut along the line A-A' in FIG. 1, the FIGS. 8 and 9 show a cut along the line B-B' in FIG. 1 and FIG. 12 shows a cut along the line C-C' in FIG. 1.

Figure 2:
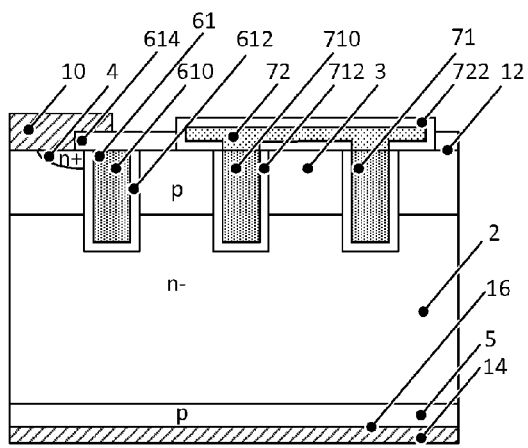
FIGS. 2 to 7 show a cut through the line A-A' of FIG. 1 of different embodiments of an IGBT according to the invention.

The IGBT 1 shown in FIG. 2 has layers between an emitter electrode 10 on an emitter side 12 and a collector electrode 14 on a collector side 16 opposite to the emitter side 12.

A lowly (n-) doped drift layer 2 is arranged in the IGBT 1. Exemplarily, the drift layer 2 has a constantly low doping concentration. Therein, the substantially constant doping concentration of the drift layer 2 means that the doping concentration is substantially homogeneous throughout the drift layer 2, however without excluding that fluctuations in the doping concentration within the drift layer 2 being in the order of a factor of one to five may be possibly present. The drift layer thickness and doping concentration is chosen due to the application needs. An exemplary doping concentration of the drift layer 2 is between $5*10^{12}$ cm$^{-3}$ and $5*10^{14}$ cm$^{-3}$.

A p doped collector layer 5, which electrically contacts the collector electrode 14, is arranged between the drift layer 2 and the collector electrode 14. The collector layer 5 may exemplarily have a maximum doping concentration in a range of $5*10^{15}$ ... $1*10^{17}$ cm$^{-3}$.

FIG. 6 shows another inventive IGBT 1 comprising an n doped buffer layer 28 having a higher doping concentration than the drift layer 2, which buffer layer 28 is arranged between the drift layer 2 and the collector layer 5.

The inventive emitter sided design can also be applied to a reverse conducting IGBT (FIG. 7), in which in the same plane as the collector layer 5 (i.e. on the collector side 16 and lateral to the collector layer 5), an n doped first region 26 is arranged as shown in FIG. 7. The first region 26 is thus arranged alternating to the collector layer 5. The first region 26 has a higher doping concentration than the drift layer 8, and, if present also a higher maximum doping concentration than the buffer layer 28.

A p doped base layer 3 is arranged between the drift layer 2 and the emitter electrode 10, which base layer 3 electrically contacts the emitter electrode 10. The base layer 3 may have a maximum doping concentration of at most $1*10^{18}$ cm$^{-3}$.

Figure 13:
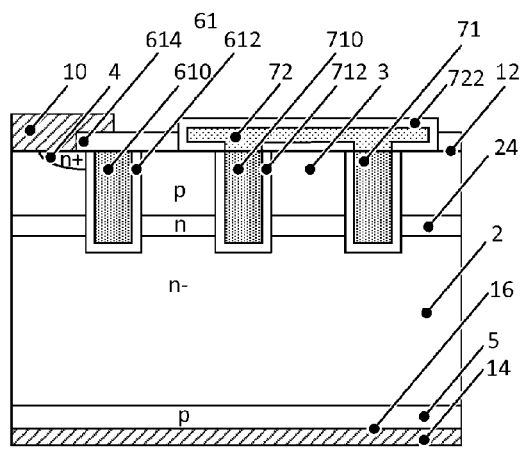
FIG. 13 shows a cut through the line A-A' of FIG. 1.

An n doped source region 4 is arranged on the base layer 3 towards the emitter side 12 and electrically contacts the emitter electrode 10, which source region 4 has a higher doping concentration than the drift layer 2. The term that the source region 4 is arranged on the base layer 3 shall mean that in the area in which the source region 4 is arranged, it is arranged between the base layer 3 and the emitter side 12, i.e. between base layer 4 and any electrode or insulating layer arranged on top of the doped layers on the emitter side 12 like the emitter electrode 10 or an insulating layer like the fifth insulating layer 614. Thus, the base layer 3 separates the source region 4 form the drift layer 2. In another alternative embodiment shown in FIG. 13, an n doped enhancement layer 24 having a higher doping concentration than the drift layer 2 is arranged between the base layer 3 and the drift layer 2, so that the enhancement layer 24 separates the base layer 3 from the drift layer 2.

A first gate unit 6 comprises at least two first trench gate electrodes 61 and at least two planar gate electrodes 62. Each first trench gate electrode 61 has a first electrically conductive layer 610 and a first insulating layer 612, wherein each first electrically conductive layer 610 is separated from any n or p layer, which adjoins said first trench gate electrode 61, by one of the at least two first insulating layers 612. A fifth insulating layer 614 covers the first electrically conductive layer 610 and, thus insulates the first electrically conductive layer 610 against the emitter electrode 10. The source region 4 abuts on at least one first trench gate electrode 61. The source region 4 electrically contacts the emitter electrode 10 and extends to at least one of the at least two first insulating layers 612, so that a channel is formable from the drift layer 2, through the base layer 3 to the source region 5.

Each planar gate electrode 62 has a second electrically conductive layer 620 and a second insulating layer 622, wherein each second electrically conductive layer 620 is separated from any n or p doped layer, which adjoin said planar gate electrode 62, by one of the at least two second insulating layers 622. Each second electrically conductive layer 620 is arranged on top of a p+ doped bar 35 on the first main side 12. Thus, the p+ doped bar separates the planar gate electrode 62 from any other doped layer.

Each second electrically conductive layer 620 contact a first electrically conductive layer 610 such that the first and second electrically conductive layers 610, 620 form a first shape closed in itself. Exemplarily, the first and second electrically conductive layers 610, 620 are arranged alternatingly at the first shape. Thus, the first shape is self-contained and the first and second electrically conductive layers 610, 620 are on the same potential. FIG. 12 shows a cut through the line C-C' of FIG. 1.

Exemplarily, two first electrically conductive layers 610 are arranged opposite to each other and two second electrically conductive layers 620 are arranged opposite to each other such that the first and second electrically conductive layers 610, 620 are arranged perpendicularly in a plane parallel to the emitter side 12, thereby forming the first shape. The two second electrically conductive layers 620 connect the first electrically conductive layers such that an enclosed area is arranged within the first shape. The first shape only encloses the area, in which a second gate unit is arranged, to the lateral sides, i.e. perpendicular to the first and second main side 12, 16. Under "lateral" the case shall be covered, in which the first electrically conductive layers 610 are arranged up to the first main side 12 and the second electrically conductive layers 620 are arranged on top of the first main side 12, whereas the layers 610, 620 are adjoining each other. Thus, from a top view, i.e. from a view perpendicular to first main side 12, the first shape encloses the second gate unit 7. Thus, by the first and second electrically conductive layers 610, 620 adjoining each other, the first shape is formed. Also in the case, in which the first and electrically conductive layers 610, 620 are arranged in different planes (wherein the planes are arranged parallel to the emitter side 12), but connected to each other by an interface, at which the first and second electrically conductive layers 610, 620 contact each other, shall form a first shape closed in itself, by which the first gate unit 6 encloses the second gate unit 7.

The second gate unit 7 comprises at least one second trench gate electrode 71. Each second trench gate electrode 71 comprises a third insulating layer 712 and a third electrically conductive layer 710, which has an electrical contact 11, via which the third electrically conductive layer 710 is electrically connected to the emitter electrode 10.

Figure 3:
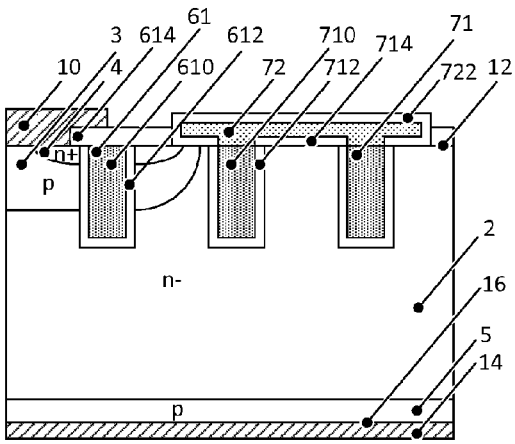
Figure 4:
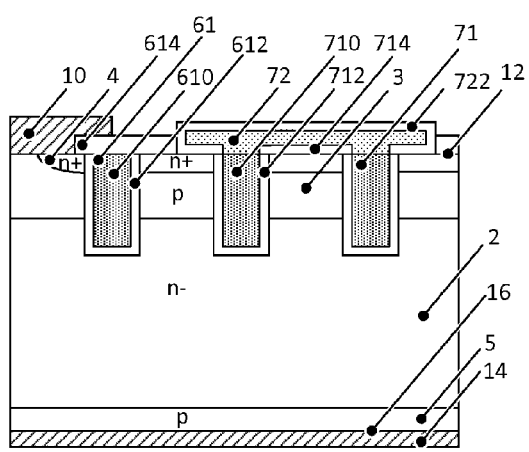

In an exemplary embodiment, in the area of the second gate units 7 no source regions are arranged. Alternatively, source regions 4 contact the third insulating layer 712 of the third trench gate electrodes 71 (FIG. 4) or extend at least to a region below the insulating layer 614 or even 714 between the first trench gate electrode 61 and the second trench gate electrode 71 (FIG. 3). Also the base layer 3 may be arranged in the area of the second gate unit as shown in FIG. 2 or it may just extend to a region below the insulating layer 614 or 714 (FIGS. 3, 5, 10 and 11).

Figure 5:
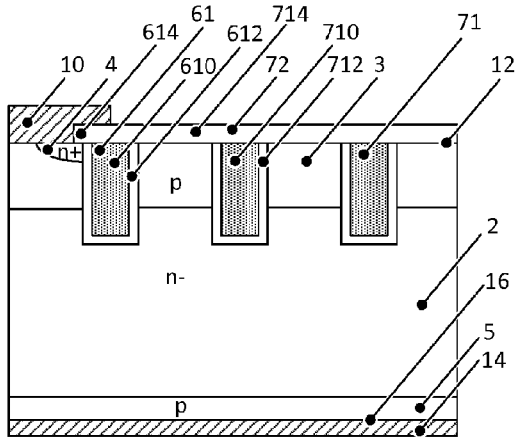

In another exemplary embodiment, the second gate unit 7 comprises a plurality of second trench gate electrodes 71, which are arranged in a distance from each other, which distance corresponds at maximum to a depth of the second trench gate electrodes 71 from the emitter side 12. The depth shall be the maximum extension (depth) of the second trench gate electrodes 71 from the emitter side 12. The second trench gate electrodes 71 may be formed as stripes, which have in a plane parallel to the emitter side 12 an extension in a length direction, which is greater than its extension in a width direction (e.g. perpendicular to the length direction), exemplarily the length is at least five times its width. On top of the at least one third electrically conductive layer 710, an eighth insulating layer 714 may be arranged, which covers the at least one third electrically conductive layer 710 besides the contact to the emitter electrode 10 (FIG. 5).

In another exemplary embodiment, the device comprises a plurality of third electrically conductive layers 710, which are covered by a fifth electrically conductive layer 72, which connects the plurality of third electrically conductive layers 710. The fifth electrically conductive layer 72 is separated from any n or p doped layer by the eighth insulating layer 714. In this embodiment, the contact 11 of the plurality of third electrically conductive layers 71 to the emitter electrode 10 may be made via the fifth electrically conductive layer 72. Exemplarily, the fifth electrically conductive layer 72 is made of the same material as the at least one third electrically conductive layer 710.

The fifth electrically conductive layer 72 may extend outside the third electrically conductive layer 710 in a plane parallel to the emitter side 12 by less than the distance between the second (dummy) and the first trench gate electrode (active) 61, 71 in order to prevent the shorting between them. The distance shall be measured between the first trench gate electrode 61 and such second trench gate electrode 71 which is arranged closest to the first trench gate electrode 61. The fifth electrically conductive layer 72 may completely cover each of the at least one third electrically conductive layers 71.

By its contact 11 between the emitter electrode 10 and the second trench gate electrode 71 or the fifth electrically conductive layer 72, the electrically conductive layer 72 and the second trench gate electrode 71 are on the same potential as the emitter electrode 10. Layers 71, 72 are not therefore controllable like the first trench gate electrodes 61. Thus, they do not have negative impact on the switching performance due to an increased capacitive effect on the gate.

At least two third trench gate electrodes 8 are arranged between one of the at least one planar gate electrode 62 and the second gate unit 7 such that at least two first and third trench gate electrodes 61, 8 are electrically connected and form a second shape closed in itself so that at least two planar gate electrode 62 and at least two first trench gate electrodes 61 enclose the second gate unit 7, such that each third trench gate electrode 8 separates at least one of at least two bars 35 and at least one of the at least two planar gate electrodes 62 from the second gate unit 7. The base layer 3 separates the second gate unit 7 from the enclosing second shape in a plane parallel to the emitter side 12.

Each of the at least two third trench gate electrode 8 has a fourth electrically conductive layer 80 and a fourth insulating layer 82, wherein the fourth electrically conductive layer 80 is separated from any n or p doped layer, which adjoin said third trench gate electrode, by the fourth insulating layer 82. The electrically conductive fourth layer 80 is covered by a seventh insulating layer 84, which thereby separates the electrically conductive fourth layer 80 from the emitter electrode 10.

Thus, the second shape is self-contained and the first and third electrically conductive layers 610, 80 are on the same potential. Exemplarily, two first electrically conductive layers 610 are arranged opposite to each other and two third electrically conductive layers 620 are arranged opposite to each other and perpendicularly to the electrically conductive layers 620 such that the first and third electrically conductive layers 610, 80 are arranged perpendicularly in a plane parallel to the emitter side 12, thereby forming the second shape. The two third electrically conductive layers 80 connect the first electrically conductive layers such that an enclosed area is arranged within the second shape. The second shape encloses the area, in which the second gate unit is arranged, only to the lateral sides, i.e. perpendicular to the first and second main side 12, 16.

Exemplarily, the third trench gate electrodes 8 are arranged parallel to the planar gate electrodes 62. As the third trench gate electrodes 8 are connected to the first trench gate electrodes 61 and these are connected to the planar gate electrodes 62, the gate electrodes 61, 62, 8 are all on the same potential.

At least two p doped bars 35 are arranged below the planar gate electrode 62 such that each bar 35 separates at least one planar gate electrode 62 from any other n or p doped layer at least on a side opposite to a third trench gate electrode 8. The at least one bar 35 has at least one of a higher maximum doping concentration or a greater depth from the emitter side 12 than the base layer 3. At least one of the at least one bar 35 may have a maximum doping concentration of at most $5*10^{18}$ cm$^{-3}$.

Each bar 35 extends to and electrically contacts the emitter electrode 10. At least one of the at least two bars 35 may electrically contact the emitter electrode 10 outside of the first gate unit 6. Exemplarily, the bars 35 are formed as a stripe having in a plane parallel to the emitter side 12 a length direction, which is larger than a width direction. The bars 35 separate the planar gate electrode 62 along their length direction from the other doped layers. The bars 35 extend along their length direction further to the emitter electrode 10 at both ends of the stripes.

Figure 10:
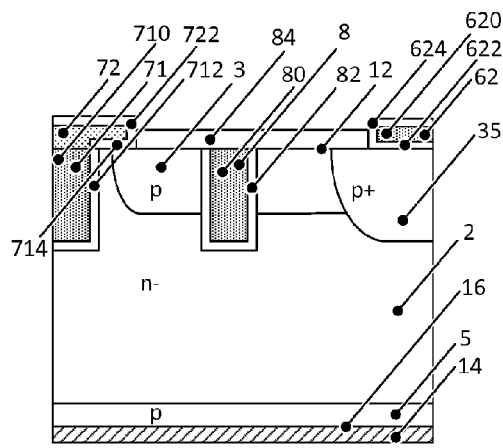
Figure 11:
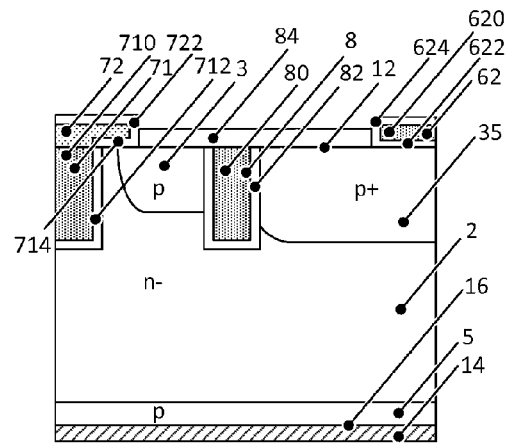

In an exemplary embodiment, the bars 35 are separated from such third trench gate electrode 8, which is arranged between said bar 35 and the second gate unit 7 by a distance, which corresponds at maximum to a depth of said third trench gate electrode 8 from the emitter side 12 (FIGS. 8 and 10). The depth of the third trench gate electrode 8 shall be the maximum extension to which the third trench gate electrode 8 extends from the emitter side 12. Between the bar 35 and the third trench gate electrode 8, the base layer 3 may be arranged. By having such a distance, the maximum strength of the electrical field is kept at the bottom of the trenches, far from the region of maximum current density during operation, and such that the breakdown voltage would not be limited from the P+ doped bar 35, but from other device properties like the active cell design or the wafer material. The bars 35 may also extend to a sidewall of the third trench gate electrode 8 (FIGS. 9 and 11), but they may not extend to the area beyond the third trench gate electrodes 8, i.e. to the area, in which the second gate unit 7 is arranged.

The trench and planar gate electrodes 610, 620, 710, 80 and the fifth electrically conductive layer 72 can be made of any suitable electrically conductive material, exemplarily polysilicon or metal. Exemplarily, they are made of the same material. The device itself may be made on a basis of a silicon or GaN or SiC wafer.

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

LIST OF REFERENCE SYMBOLS

1 IGBT
10 Emitter electrode
11 Electrical contact
12 Emitter side
14 Collector electrode
16 Collector side
2 Drift layer
26 First region
28 Buffer layer
3 Base layer
35 Bar
4 Source region
5 Collector layer
6 First gate unit
61 First trench gate electrode
610 First electrically conductive layer
612 First insulating layer
614 Fifth insulating layer
62 Planar gate electrode 620 second electrically conductive layer
622 Second insulating layer
624 Sixth insulating layer
7 Second gate unit
71 Second trench gate electrode
710 Third electrically conductive layer
712 Third insulating layer
714 Eighth insulating layer
72 Fifth electrically conductive layer
8 Third trench gate electrode
80 Fourth electrically conductive layer
82 Fourth insulating layer
84 Seventh insulating layer

The invention claimed is:

1. An insulated gate bipolar transistor having layers between an emitter electrode on an emitter side and a collector electrode on a collector side opposite to the emitter side, comprising:
    a lowly doped drift layer of a first conductivity type,
    a collector layer of a second conductivity type different than the first conductivity type arranged between the drift layer and the collector electrode and electrically contacts the collector electrode,
    a base layer of the second conductivity type, the base layer is arranged between the drift layer and the emitter electrode, wherein the base layer electrically contacts the emitter electrode,
    a source region of the first conductivity type arranged on the base layer towards the emitter side and electrically contacts the emitter electrode, the source region has a higher doping concentration than the drift layer,
    a first gate unit, the first pate unit comprises at least two first trench gate electrodes and at least two planar gate electrodes, wherein each first trench gate electrode has a first electrically conductive layer and a first insulating layer,
    wherein each first electrically conductive layer is separated from any layer of the first or second conductivity type by the first insulating layer, and wherein the source region abuts on at least one first trench gate electrode,
    wherein each planar gate electrode has a second electrically conductive layer and a second insulating layer, wherein each second electrically conductive layer is separated from any layer of the first or second conductivity type by the second insulating layer,
    a second gate unit, the second gate unit comprises at least one second trench gate electrode, wherein the at least one second trench gate electrode comprises a third electrically conductive layer and a third insulating layer, the at least one second trench gate electrode is separated from any layer of the first or second conductivity type by the third insulating layer, wherein the at least one third electrically conductive layer is electrically connected to the emitter electrode,
    wherein each second electrically conductive layer contacts a first electrically conductive layer such that the first and second electrically conductive layers form a first shape closed in itself, by which first shape the first gate unit encloses the second gate unit to lateral sides of the second gate unit, the lateral sides are arranged perpendicular to a first main side and a second main side,
    at least two third trench gate electrodes, each of which has a fourth electrically conductive layer and a fourth insulating layer, wherein the fourth electrically conductive layer is separated from any layer of the first or second conductivity type by the fourth insulating layer,
    wherein each of the third trench gate electrode is arranged between one of the at least two planar gate electrode and the second gate unit such that at least two first and third trench gate electrodes are electrically connected and form a second shape closed in itself by which second shape the second gate unit is enclosed,
    at least two bars of the second conductivity type, each of which is arranged below the planar gate electrode such that each bar separates a planar gate electrode from any other layer of the first or second conductivity type at least on a side opposite to the third trench gate electrode, wherein the at least two bars extend to and electrically contact the emitter electrode,
    wherein the at least two bars have at least one of a higher maximum doping concentration or a greater depth from the emitter side than the base layer,
    wherein the each third trench gate electrode separates a bar and a planar gate electrode from the second gate unit, wherein the base layer separates the second gate unit from the enclosing second shape in a plane parallel to the emitter side.

2. The insulated gate bipolar transistor according to claim 1, wherein at least one of the at least two bars is separated from the third trench gate electrode, which is arranged between said bar and the second gate unit by a distance, which wherein the distance corresponds to a maximum to a depth of said third trench gate electrode from the emitter side.

3. The insulated gate bipolar transistor according to claim 1, wherein an enhancement layer of the first conductivity type, which has higher doping concentration than the drift layer is arranged between the base layer and the drift layer, wherein the enhancement layer separates the base layer from the drift layer.

4. The insulated gate bipolar transistor according to claim 1, wherein the insulated gated bipolar transistor comprises a first region of the first conductivity type arranged on the collector side laterally to the collector layer, wherein the first region has a higher doping concentration than the drift layer.

5. The insulated gate bipolar transistor according to claim 1, wherein the second gate unit comprises a plurality of second trench gate electrodes arranged in a distance from each other, wherein the distance corresponds at maximum to a depth of the second trench gate electrodes from the emitter side.

6. The insulated gate bipolar transistor according to claim 1, wherein the at least one third electrically conductive layer is covered by a fifth electrically conductive layer, which connects a plurality of the at least two third electrically conductive layers and wherein the contact of the at least one third electrically conductive layer to the emitter electrode is made via the fifth electrically conductive layer.

7. The insulated gate bipolar transistor according to claim 6, wherein the fifth electrically conductive layer is made of the same material as the at least two third electrically conductive layers.

8. The insulated gate bipolar transistor according to claim 6, wherein the fifth electrically conductive layer extends outside at least one of the at least two third electrically conductive layers in a plane parallel to the emitter side by less than the distance between the second and the first trench gate electrode on each side or wherein the fifth electrically conductive layer completely covers each of the at least one third electrically conductive layers.

9. The insulated gate bipolar transistor according to claim 1, wherein no source region contacts the third trench gate electrode.

10. The insulated gate bipolar transistor according to claim 1, wherein no source region contacts the second gate unit.

11. The insulated gate bipolar transistor according to claim 1, wherein at least one of the at least two bars has a maximum doping concentration of at most $5*10^{18}$ cm$^{-3}$.

12. The insulated gate bipolar transistor according to claim 1, wherein the base layer has a maximum doping concentration of at most $1*10^{18}$ cm$^{-3}$.

13. The insulated gate bipolar transistor according to claim 1, wherein at least one of the at least two bars electrically contacts the emitter electrode outside of the first gate unit.

14. The insulated gate bipolar transistor according to claim 1, wherein at least one of the at least two bars electrically contacts the emitter electrode on two sides, between which two sides each of the at least two bars separate one of the at least one planar gate electrode from any other layer of the first or second conductivity type at least on a side opposite to the third trench gate electrode.

15. The insulated gate bipolar transistor according to claim 1, wherein at least one of the at least two bars is separated from the third trench gate electrode, which is arranged between said bar and the second gate unit by a distance, wherein the distance corresponds to a maximum to a depth of said third trench gate electrode from the emitter side, and an enhancement layer of the first conductivity type, which has higher doping concentration than the drift layer is arranged between the base layer and the drift layer, wherein the enhancement layer separates the base layer from the drift layer.

16. The insulated gate bipolar transistor according to claim 15, wherein the insulated gated bipolar transistor comprises a first region of the first conductivity type arranged on the collector side laterally to the collector layer, wherein the first region has a higher doping concentration than the drift layer, and the second gate unit comprises a plurality of second trench gate electrodes arranged in a distance from each other, wherein the distance corresponds at maximum to a depth of the second trench gate electrodes from the emitter side.

17. The insulated gate bipolar transistor according to claim 16, wherein the at least one third electrically conductive layer is covered by a fifth electrically conductive layer, which connects a plurality of the at least two third electrically conductive layers and wherein the contact of the at least one third electrically conductive layer to the emitter electrode is made via the fifth electrically conductive layer, and the fifth electrically conductive layer is made of the same material as the at least two third electrically conductive layers.

18. The insulated gate bipolar transistor according to claim 17, wherein the fifth electrically conductive layer extends outside at least one of the at least two third electrically conductive layers in a plane parallel to the emitter side by less than the distance between the second and the first trench gate electrode on each side or wherein the fifth electrically conductive layer completely covers each of the at least one third electrically conductive layers.

19. The insulated gate bipolar transistor according to claim 18, wherein no source region contacts the third trench gate electrode, no source region contacts the second gate unit, at least one of the at least two bars has a maximum doping concentration of at most $5*10^{18}$ cm$^{-3}$ and the base layer has a maximum doping concentration of at most $1*10^{18}$ cm$^{-3}$.

20. The insulated gate bipolar transistor according to claim 19, wherein at least one of the at least two bars electrically contacts the emitter electrode outside of the first gate unit, and at least one of the at least two bars electrically contacts the emitter electrode on two sides, between which two sides each of the at least two bars separate one of the at least one planar gate electrode from any other layer of the first or second conductivity type at least on a side opposite to a third trench gate electrode.

* * * * *